US009455014B1

(12) United States Patent
Lee et al.

(10) Patent No.: US 9,455,014 B1
(45) Date of Patent: Sep. 27, 2016

(54) ADJUSTING RESISTIVE MEMORY WRITE DRIVER STRENGTH BASED ON WRITE ERROR RATE (WER) TO IMPROVE WER YIELD, AND RELATED METHODS AND SYSTEMS

(71) Applicant: QUALCOMM Incorporated, San Diego, CA (US)

(72) Inventors: Kangho Lee, San Diego, CA (US); Taehyun Kim, Cupertino, CA (US); Sungryul Kim, San Diego, CA (US); Seung Hyuk Kang, San Diego, CA (US); Jung Pill Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/818,809

(22) Filed: Aug. 5, 2015

Related U.S. Application Data

(60) Provisional application No. 62/135,343, filed on Mar. 19, 2015.

(51) Int. Cl.
| | | |
|---|---|---|
| *G11C 11/00* | (2006.01) | |
| *G11C 11/14* | (2006.01) | |
| *G11C 11/15* | (2006.01) | |
| *G11C 11/16* | (2006.01) | |
| *G11C 29/44* | (2006.01) | |

(52) U.S. Cl.
CPC ........... *G11C 11/1675* (2013.01); *G11C 29/44* (2013.01)

(58) Field of Classification Search
USPC .......................... 365/148, 158, 163, 171, 173
See application file for complete search history.

(56) References Cited

U.S. PATENT DOCUMENTS

| | | | |
|---|---|---|---|
| 6,584,589 B1 | 6/2003 | Perner et al. | |
| 6,865,104 B2 | 3/2005 | Perner | |
| 8,437,180 B2* | 5/2013 | Higo | G11C 11/16 365/148 |
| 8,711,646 B2* | 4/2014 | Ong | G11C 29/06 365/148 |
| 8,929,132 B2* | 1/2015 | Alam | G11C 11/1675 365/158 |
| 9,286,976 B2* | 3/2016 | Lin | G11C 13/004 |
| 2012/0069638 A1 | 3/2012 | Matsuda et al. | |
| 2013/0155760 A1 | 6/2013 | Houssameddine | |
| 2014/0157065 A1 | 6/2014 | Ong | |

* cited by examiner

*Primary Examiner* — Trong Phan
(74) *Attorney, Agent, or Firm* — Withrow & Terranova, PLLC

(57) ABSTRACT

Aspects for adjusting resistive memory write driver strength based on write error rate (WER) are disclosed. In one aspect, a write driver strength control circuit is provided to adjust a write current provided to a resistive memory based on a WER of the resistive memory. The write driver strength control circuit includes a tracking circuit configured to determine the WER of the resistive memory based on write operations performed on resistive memory elements. The write driver strength control circuit includes a write current calculator circuit configured to compare the WER to a target WER that represents the desired yield performance level of the resistive memory. A write current adjust circuit in the write driver strength control circuit is configured to adjust the write current based on this comparison. The write driver strength control circuit adjusts the write current to perform write operations while reducing write errors associated with breakdown voltage.

20 Claims, 7 Drawing Sheets

$$WER = \frac{1}{2} \text{erfc}\left(\frac{V_w - V_{c50}}{\sigma_t \sqrt{2}}\right)$$

ated by activating the word line 114, which couples a write current ($I_w$) from the write driver 118 on the source line 116 to the bottom electrode 112. The write current ($I_w$) provided by the write driver 118 to the MTJ 104 must be strong enough to change the magnetic orientation of the free layer 108. Particularly, the write current ($I_w$) must be at least equal to the critical switching current ($I_c$) to change the magnetic orientation of the free layer 108, wherein the critical switching current ($I_c$) is the current required to change the magnetic orientation. If the magnetic orientation is to be changed from AP to P, a current flowing from the top electrode 122 to the bottom electrode 112 induces a spin transfer torque (STT) at the free layer 108 that can change the magnetic orientation of the free layer 108 to P with respect to the pinned layer 106. If the magnetic orientation is to be changed from P to AP, a current flowing from the bottom electrode 112 to the top electrode 122 induces an STT at the free layer 108 to change the magnetic orientation of the free layer 108 to AP with respect to the pinned layer 106.

In this regard, because writing to MTJs requires a change in the orientation of a magnetic field, writing to MTJs is inherently probabilistic. More specifically, the critical switching current ($I_c$) of the MTJ 104 may vary over time. Thus, applying the write current ($I_w$) to the MTJ 104 during a first write operation may cause the magnetic orientation of the free layer 108 to properly change orientation, resulting in a successful write. Conversely, applying the write current ($I_w$) to the MTJ 104 during a second write operation may not cause the magnetic orientation of the free layer 108 to properly change orientation, resulting in a write failure. One option to overcome the probabilistic nature of MTJs and reduce the amount of corresponding write failures is to increase the strength of the write current ($I_w$) to a constant level exceeding the critical switching current ($I_c$). However, because the MTJ 104 is a resistive memory element with a given resistance level (R(mtj)), applying the write current ($I_w$) to the MTJ 104 during a write operation generates a voltage (V(mtj)) across the MTJ 104 according to (V(mtj)) =($I_w$)*(R(mtj)). Further, due to process, voltage, and temperature (PVT) variations related to MTJ fabrication, multiple MTJs of the same design and fabrication process may have varying resistance levels (R(mtj)). Applying a write current ($I_w$) whose strength exceeds the level of the critical switching current ($I_c$) could cause certain MTJs with higher resistances (R(mtj)) to breakdown as a result of generating a breakdown voltage (V(bd)), while other MTJs of the same design with lower resistances (R(mtj)) would not breakdown. Thus, although increasing the strength of the write current ($I_w$) to a constant level exceeding the critical switching current ($I_c$) may avoid write failures due to the probabilistic nature of MTJs, doing so may increase write failures attributable to breakdown, making it difficult to achieve a target write error rate (WER) yield.

Therefore, it would be advantageous to provide a write current ($I_w$) to MTJs in an MRAM that is strong enough to successfully perform write operations, while remaining low enough to reduce write errors associated with breakdown voltage (V(bd)) so as to achieve a target WER yield.

ADJUSTING RESISTIVE MEMORY WRITE DRIVER STRENGTH BASED ON WRITE ERROR RATE (WER) TO IMPROVE WER YIELD, AND RELATED METHODS AND SYSTEMS

PRIORITY APPLICATION

The present application claims priority to U.S. Provisional Patent Application Ser. No. 62/135,343 filed on Mar. 19, 2015 and entitled "ADJUSTING RESISTIVE MEMORY WRITE DRIVER STRENGTH BASED ON WRITE ERROR RATE (WER) TO IMPROVE WER YIELD, AND RELATED METHODS AND SYSTEMS," the contents of which is incorporated herein by reference in its entirety.

BACKGROUND

I. Field of the Disclosure

The technology of the disclosure relates generally to non-volatile memory, and particularly to memory write driver circuits for providing write currents to a memory to perform write operations.

II. Background

Processor-based computer systems include memory for data storage. Memory systems are composed of resistive memory elements capable of storing data, wherein the form of the stored data depends on the type of memory employed. In particular, magnetic random access memory (MRAM) is an example of non-volatile memory in which data is stored by programming a magnetic tunnel junction (MTJ) of an MRAM bitcell. Data is stored in an MTJ as a magnetic state, wherein no electric current is required to preserve a stored data value. Thus, an MTJ can store data even when power is not supplied to the MTJ. Conversely, memory that stores data in the form of an electric charge, such as static random access memory (SRAM), requires power to preserve a stored data value. Thus, because an MTJ may store information even when power is turned off, particular circuits and systems may benefit from employing MRAM.

In this regard, FIG. 1 illustrates an exemplary MRAM bitcell 100 that includes a metal-oxide semiconductor (MOS) (typically n-type MOS, i.e., NMOS) access transistor 102 integrated with an MTJ 104 for storing non-volatile data. The MRAM bitcell 100 may be provided in an MRAM memory used as memory storage for any type of system requiring electronic memory, such as a central processing unit (CPU) or processor-based system, as examples. The MTJ 104 includes a pinned layer 106 and a free layer 108 disposed on either side of a tunnel barrier 110 formed by a thin non-magnetic dielectric layer. When the magnetic orientation of the pinned layer 106 and the free layer 108 are anti-parallel (AP) to each other, a first memory state exists (e.g., a logical '1'). When the magnetic orientation of the pinned layer 106 and the free layer 108 are parallel (P) to each other, a second memory state exists (e.g., a logical '0'). Further, the access transistor 102 controls reading and writing data to the MTJ 104. A drain (D) of the access transistor 102 is coupled to a bottom electrode 112 of the MTJ 104, which is coupled to the pinned layer 106. A word line 114 is coupled to a gate (G) of the access transistor 102. A source (S) of the access transistor 102 is coupled to a source line 116, which is coupled to a write driver 118. A bit line 120 is coupled to the write driver 118 and a top electrode 122 of the MTJ 104, which is coupled to the free layer 108.

With continuing reference to FIG. 1, when writing data to the MTJ 104, the gate (G) of the access transistor 102 is

SUMMARY OF THE DISCLOSURE

Aspects disclosed in the detailed description include adjusting resistive memory write driver strength based on write error rate (WER) to improve WER yield. Related methods and systems are also disclosed. In one aspect, a write driver strength control circuit is provided to adjust a write current ($I_w$) provided by a write driver to a resistive memory based on a WER of the resistive memory. The write driver strength control circuit includes a tracking circuit. The tracking circuit is configured to determine the WER of the resistive memory based on write operations performed on resistive memory elements. The write driver strength control circuit also includes a write current calculator circuit. The write current calculator circuit is configured to compare the WER to a target WER, wherein the target WER represents the desired yield performance level of the resistive memory. A write current adjust circuit included in the write driver strength control circuit is configured to adjust the write current ($I_w$) based on the comparison of the WER to the target WER. Thus, the write driver strength control circuit adjusts the write current ($I_w$) so as to be strong enough to successfully perform write operations, while remaining low enough to reduce write errors associated with breakdown voltage (V(bd)) so as to achieve the target WER (e.g, a target WER yield).

In this regard, in one aspect, a write driver strength control circuit for adjusting a write current for a resistive memory is disclosed. The write driver strength control circuit comprises a tracking circuit. The tracking circuit is configured to determine a write error rate of a resistive memory based on at least one write operation performed on at least one resistive memory element in the resistive memory, wherein a write driver applies a write current to the at least one resistive memory element for the at least one write operation. The write driver strength control circuit further comprises a write current calculator circuit configured to compare the write error rate and a target write error rate of the resistive memory. The write driver strength control circuit further comprises a write current adjust circuit configured to adjust the write current provided by the write driver to the resistive memory based on the comparison of the write error rate to the target write error rate.

In another aspect, a write driver strength control circuit for adjusting a write current for a resistive memory is disclosed. The write driver strength control circuit comprises a means for determining a write error rate of a resistive memory based on at least one write operation performed on at least one resistive memory element in the resistive memory, wherein a write driver applies a write current to the at least one resistive memory element for the at least one write operation. The write driver strength control circuit further comprises a means for comparing the write error rate and a target write error rate for the resistive memory. The write driver strength control circuit further comprises a means for adjusting the write current provided by the write driver to the resistive memory based on the comparison of the write error rate to the target write error rate.

In another aspect, a method of adjusting a write current for a resistive memory is disclosed. The method comprises determining a write error rate of a resistive memory based on at least one write operation performed on at least one resistive memory element in the resistive memory, wherein a write driver applies a write current to the at least one resistive memory element for the at least one write operation. The method further comprises comparing the write error rate and a target write error rate for the resistive memory. The method further comprises adjusting the write current provided by the write driver to the resistive memory based on the comparison of the write error rate to the target write error rate.

In another aspect, a magnetic random access memory (MRAM) system is disclosed. The MRAM system comprises an MRAM. The MRAM system further comprises a write driver configured to provide a write current to the MRAM. The MRAM system further comprises a write driver strength control circuit. The writer driver strength control circuit comprises a tracking circuit configured to determine a write error rate of the MRAM based on at least one write operation performed on at least one MRAM element in the MRAM, wherein the write driver applies the write current to the at least one MRAM element for the at least one write operation. The write driver strength control circuit further comprises a write current calculator circuit configured to compare the write error rate and a target write error rate of the MRAM. The write driver strength control circuit further comprises a write current adjust circuit configured to adjust the write current provided by the write driver to the MRAM based on the comparison of the write error rate to the target write error rate.

DETAILED DESCRIPTION

Figure 1:
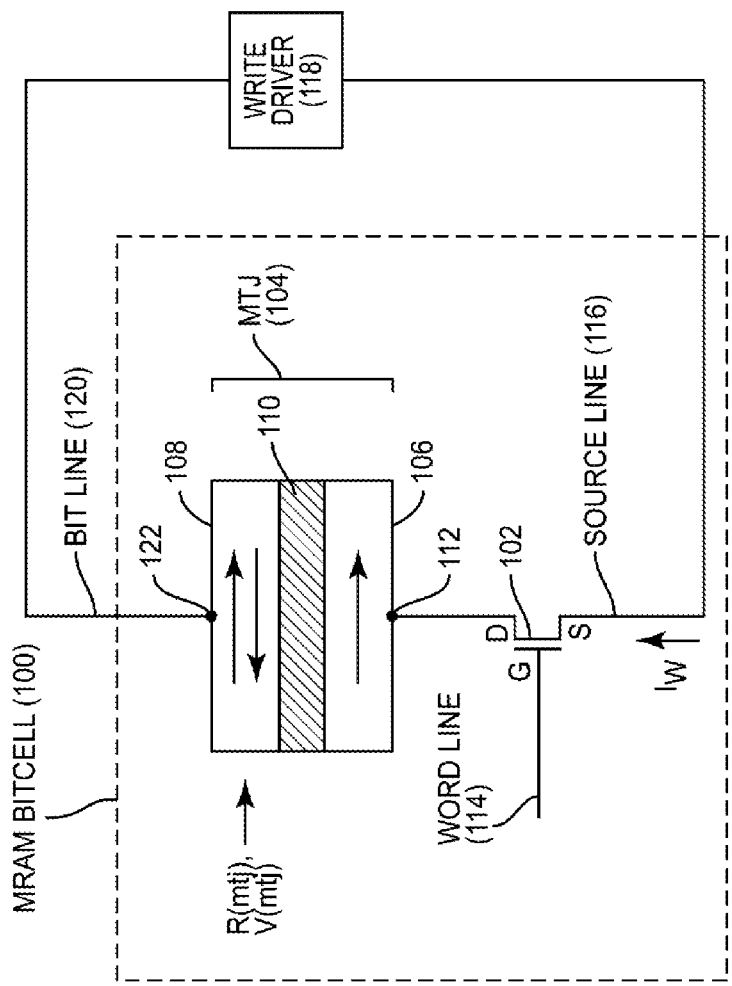
FIG. 1 is a diagram of an exemplary magnetic random access memory (MRAM) bitcell employing a magnetic tunnel junction (MTJ) and a write driver configured to write data into the MRAM bitcell.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include adjusting resistive memory write driver strength based on write error rate (WER) to improve WER yield. Related methods and systems are also disclosed. In one aspect, a write driver strength control circuit is provided to adjust a write current ($I_w$) provided by a write driver to a resistive memory based on a WER of the resistive memory. The write driver strength control circuit includes a tracking circuit. The tracking circuit is configured to determine the WER of the resistive memory based on write operations performed on resistive memory elements. The write driver strength control circuit also includes a write current calculator circuit. The write current calculator circuit is configured to compare the WER to a target WER, wherein the target WER represents the desired yield performance level of the resistive memory. A write current adjust circuit included in the write driver strength control circuit is configured to adjust the write current ($I_w$) based on the comparison of the WER to the target WER. Thus, the write driver strength control circuit adjusts the write current ($I_w$) so as to be strong enough to successfully perform write operations, while remaining low enough to reduce write errors associated with breakdown voltage (V(bd)) so as to achieve the target WER (e.g., a target WER yield).

Figure 2:
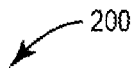
FIG. 2 is an exemplary equation illustrating a correlation between a write error rate (WER) and a write voltage ($V_w$)
Figure 4:
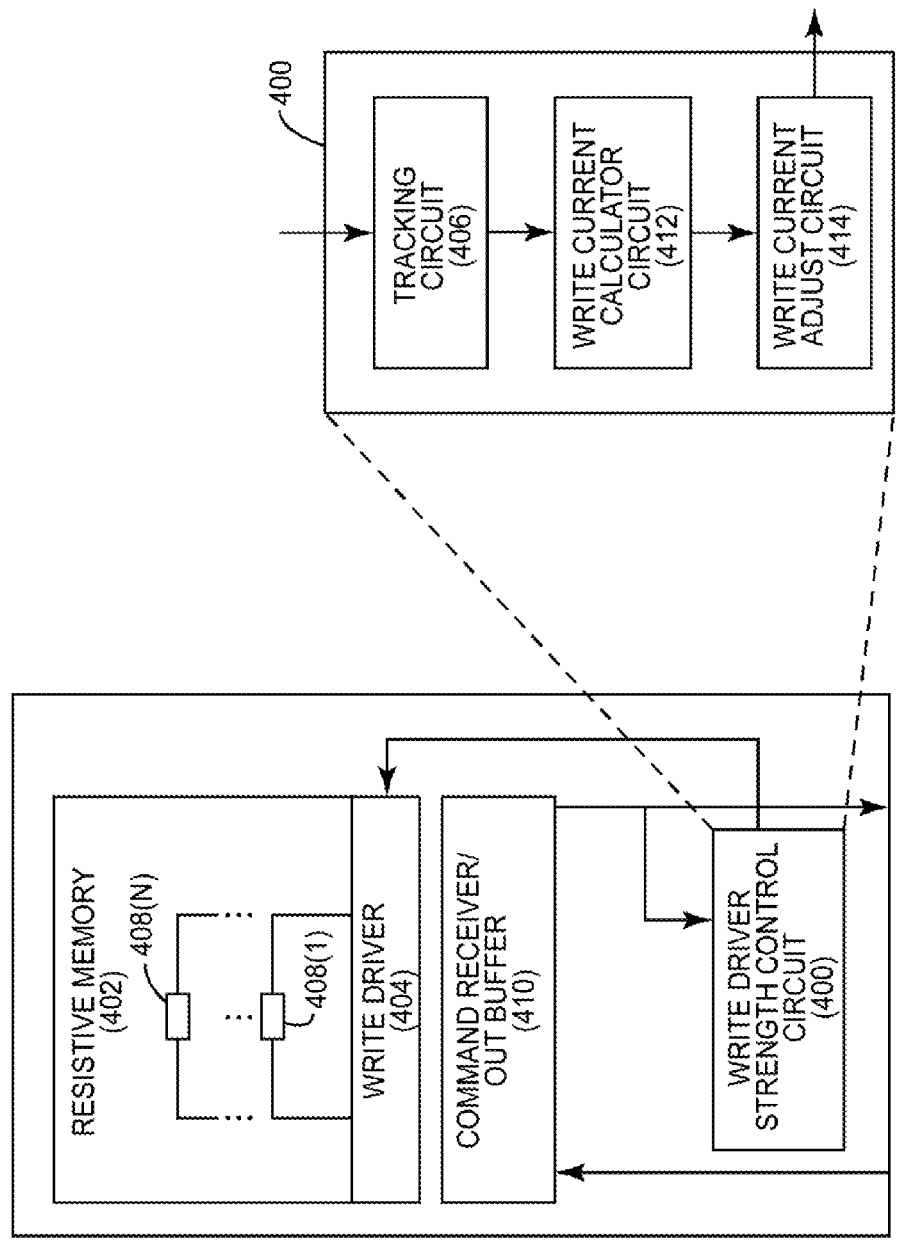
FIG. 4 is a block diagram of an exemplary write driver strength control circuit configured to adjust a write current ($I_w$) for a resistive memory based on a WER of the resistive memory to improve WER yield.

Before discussing specific details of adjusting resistive memory write driver strength based on WER starting at FIG. 4, a correlation between the WER and the write voltage ($V_w$)/write current ($I_w$) is first discussed. In this regard, FIG. 2 illustrates an exemplary equation 200 illustrating the correlation between the WER and the write voltage ($V_w$) corresponding to the write current ($I_w$) of an exemplary resistive memory (not shown). The equation 200 is produced below for reference:

$$WER = (1/2) erfc[(V_w - V_{c50})/(\sigma_{total} * \sqrt{2})]$$

In this manner, the WER may be calculated using an error function (erfc). As a non-limiting example, the error function erfc may include a special function describing diffusion via the following equation:

$$erfc(x) = \left(\frac{2}{\sqrt{\pi}}\right) \int_0^x e^{-t^{\wedge}2} dt.$$

The equation 200 uses the write voltage ($V_w$) as an operand, as well as an average critical switching voltage ($V_{c50}$). Notably, the average critical switching voltage ($V_{c50}$) corresponds to an average critical switching current ($I_{c50}$), wherein the average critical switching current ($I_{c50}$) is defined as the average write current ($I_w$) required to switch an MTJ with a fifty percent (50%) probability. Further, the equation 200 includes a total variation ($\sigma_{total}$) of a critical switching current ($I_c$) as an operand, wherein the total variation ($\sigma_{total}$) is defined as the square root of the sum of a temporal variation, squared ($\sigma^2_{temporal}$), and a spatial variation, squared ($\sigma^2_{spatial}$) ($\sigma_{total} = \sqrt{(\sigma^2_{temporal} + \sigma^2_{spatial})}$). The temporal variation ($\sigma_{temporal}$) of the critical switching current ($I_c$) describes how the level of the critical switching current ($I_c$) may vary for a single MTJ based on the probabilistic nature of switching the MTJ. Conversely, the spatial variation ($\sigma_{spatial}$) of the average critical switching current ($I_{c50}$) describes how the level of the average switching current ($I_{c50}$) may vary based on the area of an MTJ. As a non-limiting example, an MTJ with a larger area will have a smaller resistance as compared to an MTJ with a smaller area, wherein the smaller resistance will cause the MTJ to have a higher critical switching current ($I_c$). Thus, the equation 200 may be used to calculate the write voltage ($V_w$) and the corresponding write current ($I_w$) required to achieve a target WER if the remaining operands are known.

Figure 3:
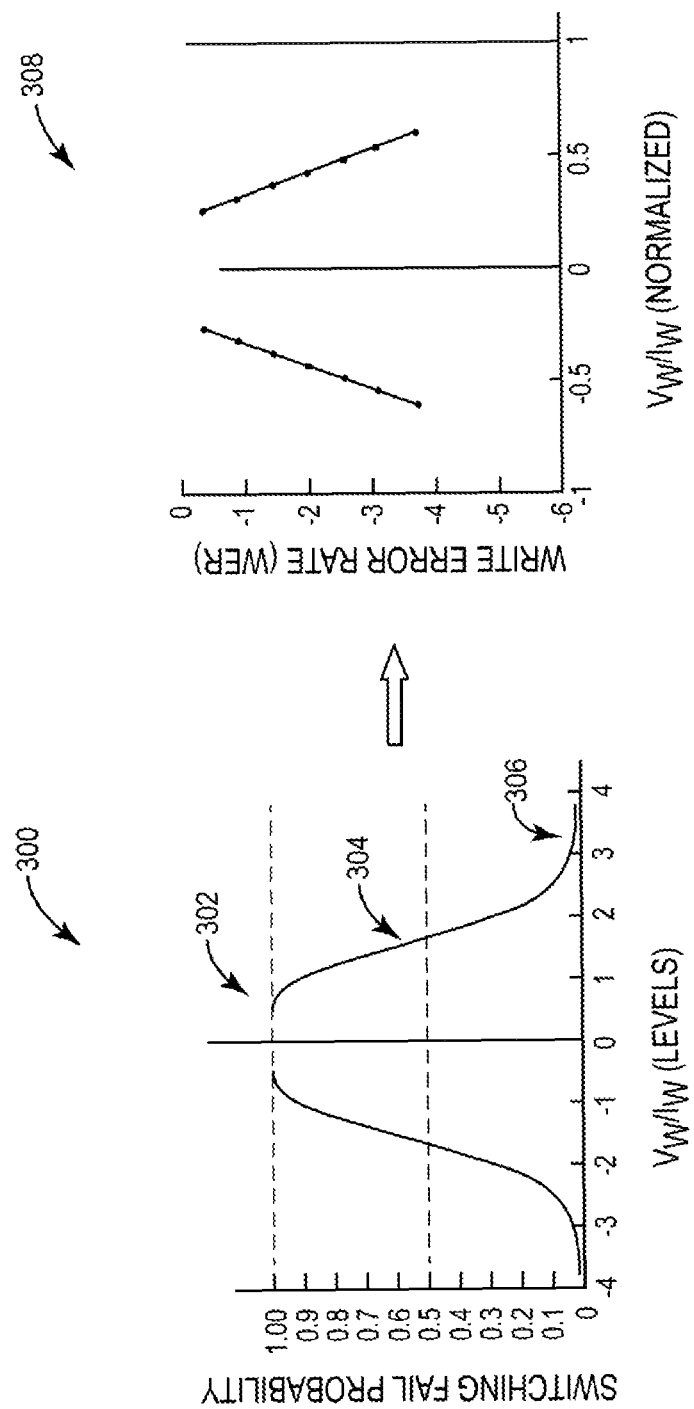
FIG. 3 includes graphs illustrating a correlation between a write voltage ($V_w$)/write current ($I_w$) and a WER of a resistive memory.

In this regard, FIG. 3 includes graphs illustrating a correlation between write voltage ($V_w$)/write current ($I_w$) and a WER of an exemplary resistive memory (not shown). Graph 300 illustrates that a switching fail probability of the exemplary resistive memory decreases as the absolute value of the write voltage ($V_w$)/write current ($I_w$) increases (notated in the graph 300 as "LEVELS"). As shown by arrow 302 in the graph 300, the switching fail probability is slightly below 1 (e.g., slightly below 100%) when the write voltage ($V_w$)/write current ($I_w$) is at a write voltage ($V_w$)/write current ($I_w$) of level 1. However, as the write voltage ($V_w$)/write current ($I_w$) increases, the switching fail probability decreases. For example, as shown by arrow 304, the switching fail probability approaches approximately 0.5 (e.g., approximately 50%) at a write voltage ($V_w$)/write current ($I_w$) of level 2. Additionally, as shown by arrow 306, the switching fail probability approaches approximately zero (e.g. approximately 0%) at and above a write voltage ($V_w$)/write current ($I_w$) of level 3. Importantly, the data represented in the graph 300 may be normalized so as to describe a linear relationship between the write voltage ($V_w$)/write current ($I_w$) and the WER. In this manner, a graph 308 illustrates that the WER decreases as the write voltage ($V_w$)/write current ($I_w$) increases. In other words, as the level of write voltage ($V_w$)/write current ($I_w$) increases, the number of write errors in the resistive memory is reduced. Thus, the write voltage ($V_w$)/write current ($I_w$) for a target WER may be determined using data similar to that represented in the graph 308.

In this regard, FIG. 4 illustrates a block diagram of an exemplary write driver strength control circuit 400 configured to adjust a write current ($I_w$) (not shown) for a resistive memory 402 based on a WER of the resistive memory 402. The write driver strength control circuit 400 is configured to adjust the write current ($I_w$) provided by a write driver 404 to the resistive memory 402. A tracking circuit 406 employed by the write driver strength control circuit 400 is configured to determine the WER of the resistive memory 402 based on a success or failure of a plurality of write operations performed on a plurality of resistive memory elements 408(1)-408(N) using a certain level of write current ($I_w$). Notably, while this aspect includes performing the plurality of write operations on the plurality of resistive memory elements 408(1)-408(N), other aspects may perform only one write operation on only a subset of the plurality of resistive memory elements 408(1)-408(N) (e.g., at least one write operation performed on at least one resistive memory element 408(1)-408(N)). Further, in this aspect, the tracking circuit 406 receives output information related to the success or failure of the write operations from a command receiver/out buffer 410 to determine the WER.

With continuing reference to FIG. 4, the write driver strength control circuit 400 also includes a write current calculator circuit 412. The write current calculator circuit 412 is configured to compare the WER to a target WER, wherein the target WER represents the desired yield performance level of write operations in the resistive memory 402. As a non-limiting example, the write current calculator circuit 412 may use the equation 200 in FIG. 2 and the correlation in the graphs 300, 308 in FIG. 3 for such a comparison. A write current adjust circuit 414 included in the write driver strength control circuit 400 is configured to adjust the write current ($I_w$) based on the comparison of the WER to the target WER performed by the write current calculator circuit 412. By basing such an adjustment on the WER achieved using the write current ($I_w$) compared to the target WER, the write driver strength control circuit 400 is configured to adjust the write current ($I_w$) so as to be strong enough to successfully perform write operations in the resistive memory 402, while remaining low enough to reduce write errors associated with breakdown voltage (V(bd)) so as to achieve the target WER. Additionally, by adjusting the write current ($I_w$) only to a level needed to achieve the target WER, an excessively high write current ($I_w$) may be avoided, thus reducing excess power consumption of the resistive memory 402.

Figure 5:
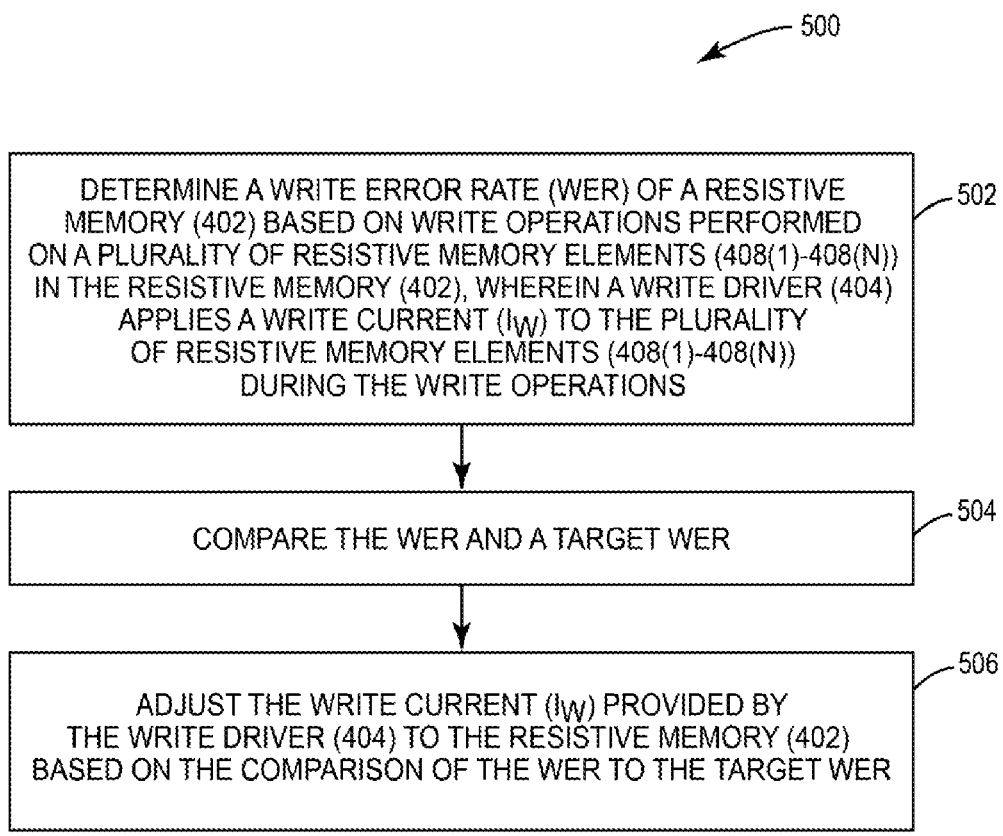
FIG. 5 is a flowchart illustrating an exemplary process employed by the write driver strength control circuit in FIG. 4 to adjust the write current ($I_w$) for the resistive memory based on the WER of the resistive memory.

In this regard, FIG. 5 provides a flowchart illustrating an exemplary process 500 that can be employed by the write driver strength control circuit 400 in FIG. 4 to adjust the write current ($I_w$) for the resistive memory 402 based on the WER of the resistive memory 402. With continuing reference to FIG. 5, the tracking circuit 406 determines the WER of the resistive memory 402 based on the outcome of the write operations performed on the plurality of resistive memory elements 408(1)-408(N) (block 502). To perform such write operations, the write driver 404 applies the write current ($I_w$) to the resistive memory elements 408(1)-408(N) during the write operations. The write current calculator circuit 412 compares the WER resulting from the write operations to a target WER (block 504). As previously described, the target WER represents a desired yield performance level of the resistive memory 402 in relation to the write operations. The write current adjust circuit 414 adjusts the write current ($I_w$) provided by the write driver 404 to the resistive memory 402 based on the comparison performed by the write current calculator circuit 412 in block 504 (block 506). The write current adjust circuit 414 adjusts the write current ($I_w$) according to the comparison of the WER to the target WER. Based on the relationship between the write current ($I_w$) and the WER described in FIG. 3, the write current ($I_w$) is adjusted to a level that enables the resistive memory 402 to achieve a WER approximately equal to the target WER. In this manner, the write driver strength control circuit 400 adjusts the write current ($I_w$) so as to be strong enough to successfully perform the write operations in the resistive memory 402, while remaining low enough to reduce write errors associated with breakdown voltage (V(bd)) so as to achieve the target WER. Additionally, by adjusting the write current ($I_w$) only to a level needed to achieve the target WER, an excessively high write current ($I_w$) may be avoided, thus reducing excess power consumption of the resistive memory 402.

Figure 6:
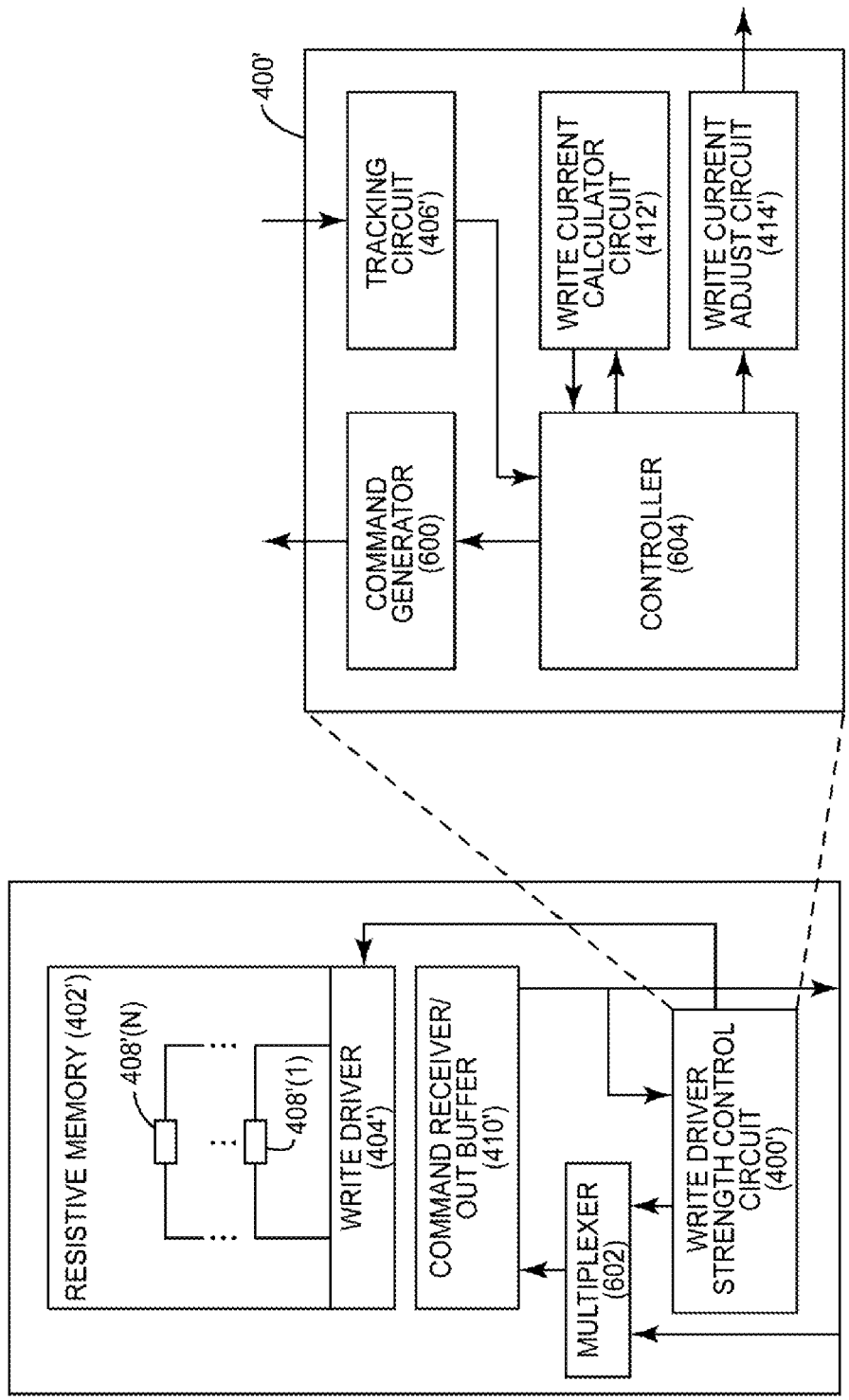
FIG. 6 is a block diagram of an exemplary write driver strength control circuit configured to adjust a write current ($I_w$) for a resistive memory based on a target WER for the resistive memory using a resistive memory write error statistical function.

In addition to the exemplary aspect provided in the write driver strength control circuit 400 in FIG. 4, other aspects may employ alternative circuits to achieve similar functionality. In this regard, FIG. 6 illustrates an exemplary write driver strength control circuit 400' configured to adjust a write current ($I_w$) (not shown) for a resistive memory 402' based on the WER of the resistive memory 402'. Notably, the write driver strength control circuit 400' includes certain components similar to components in the write driver strength control circuit 400 of FIG. 4. Such similar components that have an associated number "X" in FIG. 4 are denoted by a number "X'" in FIG. 6. In this aspect, the write driver strength control circuit 400' is configured to operate during a built-in self-test (BIST) of the resistive memory 402'. The write driver strength control circuit 400' includes a command generator 600 configured to generate write operations corresponding to the BIST (also referred to as "BIST write operations") to be performed for the purpose of the BIST, which are provided to a multiplexer 602. The multiplexer 602 is configured to select the BIST write operations originating from the command generator 600 during the BIST, and write operations originating from a corresponding system during non-BIST write operations. Thus, during the BIST, the multiplexer 602 is configured to provide the BIST write operations to a command receiver/out buffer 410' so that the BIST write operations may be performed on corresponding resistive memory elements 408'(1)-408'(N). The command receiver/out buffer 410' is configured to provide information related to the success or failure of the BIST write operations to a tracking circuit 406'.

With continuing reference to FIG. 6, the tracking circuit 406' is configured to determine the WER of the resistive memory 402' based on the information related to the success or failure of the BIST write operations performed on the resistive memory elements 408'(1)-408'(N). The tracking circuit 406' is further configured to provide the WER to a controller 604 employed in the write driver strength control circuit 400'. In this aspect, the controller 604 is configured to provide the WER to a write current calculator circuit 412', as opposed to the write current calculator circuit 412' receiving the WER directly from the tracking circuit 406'. In this manner, the controller 604 may regulate the information flow to the write current calculator circuit 412' based on the specifics of the BIST write operations. The write current calculator circuit 412' is configured to compare the WER received from the controller 604 to the target WER to determine whether and by how much the write current ($I_w$) should be adjusted for the resistive memory 402' to meet the target WER. In this aspect, the write current calculator circuit 412' is configured to determine the needed adjustment based on a resistive memory write error statistical function that extrapolates the write current ($I_w$) corresponding to the target WER based on the WER generated by the BIST write operations. Further, the write current calculator circuit 412' is configured to provide the determined level of write current ($I_w$) to the controller 604.

With continuing reference to FIG. 6, the controller 604 is configured to provide the determined level of write current ($I_w$) to a write current adjust circuit 414'. Similar to the controller 604 regulating the information flow to the write current calculator circuit 412', providing the write current ($I_w$) information to the write current adjust circuit 414' by way of the controller 604 allows such information to be regulated based on the specifics of the BIST write operations. The write current adjust circuit 414' is configured to adjust the write current ($I_w$) provided by a write driver 404' based on such information. In this aspect, the write current adjust circuit 414' is configured to adjust the write current ($I_w$) based on the above comparison if the write current ($I_w$) level resulting from a suggested adjustment is less than or equal to a defined threshold level. The defined threshold level may define an upper boundary in which the write current ($I_w$) should not exceed so as to avoid failures related to breakdown, and/or so as to reduce or avoid an increase in power consumption. Thus, the write current adjust circuit 414' may be configured to only adjust the write current ($I_w$) after determining that such an adjustment would not place the write current ($I_w$) into a restricted range. By basing such an adjustment on the resistive memory write error statistical function employed to extrapolate the level of write current ($I_w$) needed to achieve the target WER, the write driver strength control circuit 400' is configured to adjust the write current ($I_w$) so as to be strong enough to successfully perform write operations in the resistive memory 402', while remaining low enough to reduce write errors associated with breakdown voltage (V(bd)) so as to achieve the target WER.

Notably, aspects described herein employ the resistive memory 402' with the resistive memory elements 408'(1)-408'(N). In this manner, the resistive memory 402' may be any type of resistive memory, such as, but not limited to, magnetic random access memory (MRAM). In aspects that employ the resistive memory 402' using MRAM, the resistive memory elements 408'(1)-408'(N) include MRAM elements employing magnetic tunnel junctions (MTJs).

Adjusting resistive memory write driver strength based on WER according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 7:
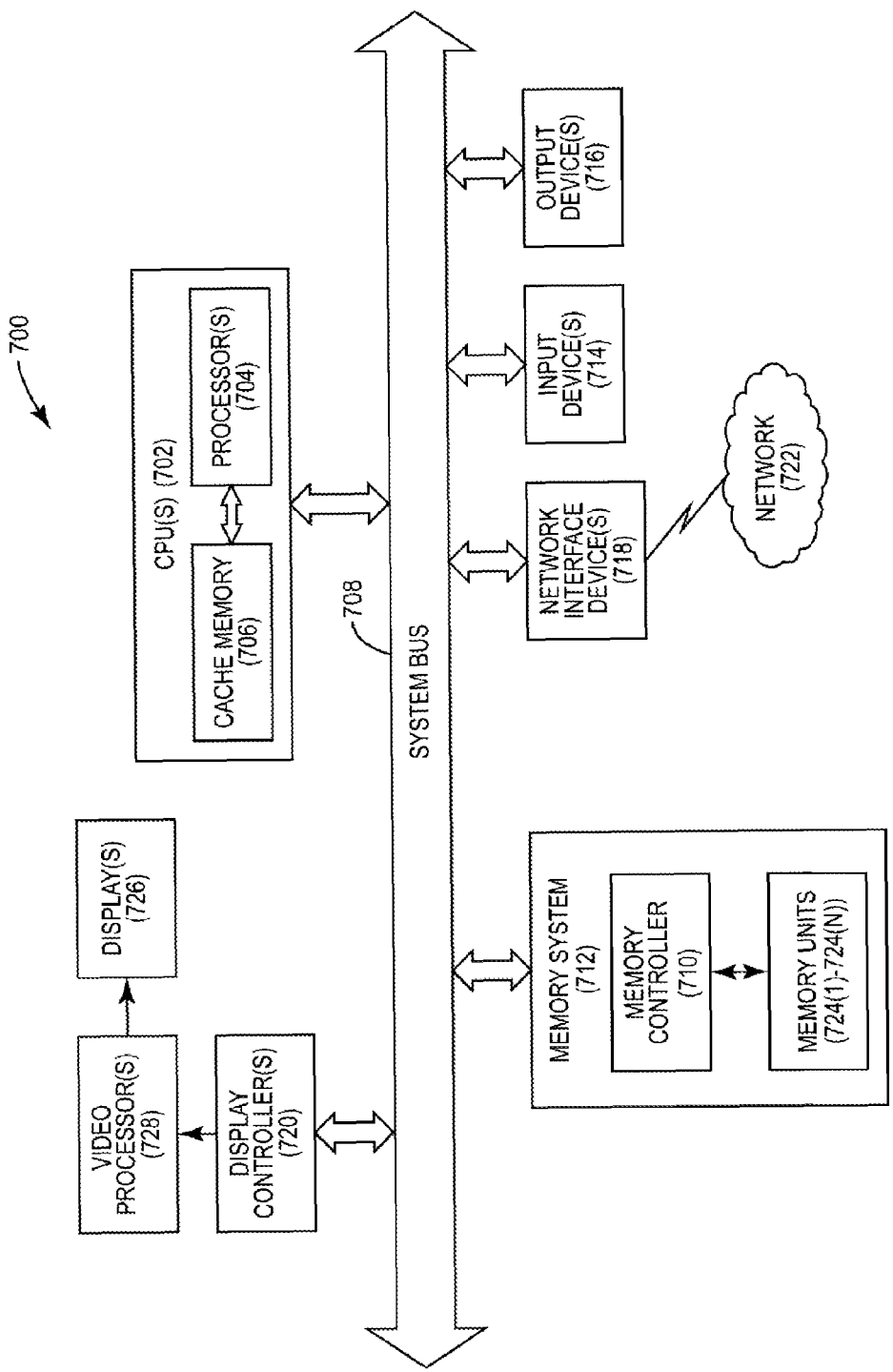
FIG. 7 is a block diagram of an exemplary processor-based system that can include the write driver strength control circuits in FIGS. 4 and 6 for improving WER yield.

In this regard, FIG. 7 illustrates an example of a processor-based system 700 that can employ the write driver strength control circuits 400 and 400' illustrated in FIGS. 4 and 6, respectively, to improve WER yield. In this example, the processor-based system 700 includes one or more central processing units (CPUs) 702, each including one or more processors 704. The CPU(s) 702 may be a master device. The CPU(s) 702 may have cache memory 706 coupled to the processor(s) 704 for rapid access to temporarily stored data. The CPU(s) 702 is coupled to a system bus 708 and can intercouple master and slave devices included in the processor-based system 700. As is well known, the CPU(s) 702 communicates with these other devices by exchanging address, control, and data information over the system bus 708. For example, the CPU(s) 702 can communicate bus transaction requests to a memory controller 710 as an example of a slave device. Although not illustrated in FIG. 7, multiple system buses 708 could be provided, wherein each system bus 708 constitutes a different fabric.

Other master and slave devices can be connected to the system bus 708. As illustrated in FIG. 7, these devices can include a memory system 712, one or more input devices 714, one or more output devices 716, one or more network interface devices 718, or one or more display controllers 720, as examples. The input device(s) 714 can include any type of input device, including but not limited to input keys, switches, voice processors, etc. The output device(s) 716 can include any type of output device, including but not limited to audio, video, other visual indicators, etc. The network interface device(s) 718 can be any device configured to allow exchange of data to and from a network 722. The network 722 can be any type of network, including but not limited to a wired or wireless network, a private or public network, a local area network (LAN), a wide local area network (WLAN), or the Internet. The network interface device(s) 718 can be configured to support any type of communications protocol desired. The memory system 712 can include one or more memory units 724(1)-724(N).

The CPU(s) 702 may also be configured to access the display controller(s) 720 over the system bus 708 to control information sent to one or more displays 726. The display controller(s) 720 sends information to the display(s) 626 to be displayed via one or more video processors 728, which process the information to be displayed into a format suitable for the display(s) 726. The display(s) 726 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A write driver strength control circuit for adjusting a write current for a resistive memory, comprising:
   a tracking circuit configured to determine a write error rate of a resistive memory based on at least one write operation performed on at least one resistive memory element in the resistive memory, wherein a write driver applies a write current to the at least one resistive memory element for the at least one write operation;
   a write current calculator circuit configured to perform a comparison of the write error rate and a target write error rate of the resistive memory; and
   a write current adjust circuit configured to adjust the write current provided by the write driver to the resistive memory based on the comparison of the write error rate to the target write error rate.

2. The write driver strength control circuit of claim 1, wherein the write current calculator circuit is configured to perform the comparison of the write error rate and the target write error rate by being configured to:
   provide the write error rate and the write current to a resistive memory write error statistical function; and
   determine the write current for the resistive memory corresponding to the target write error rate for the resistive memory based on the resistive memory write error statistical function.

3. The write driver strength control circuit of claim 2, wherein the write current calculator circuit is configured to determine the write current based on the resistive memory write error statistical function, by being configured to determine the write current by using the resistive memory write error statistical function to extrapolate the write current based on the write error rate and the target write error rate.

4. The write driver strength control circuit of claim 1, wherein the write current adjust circuit is configured to adjust the write current provided by the write driver to the resistive memory, by being configured to adjust the write current if a level of the write current resulting from a suggested adjustment is less than or equal to a defined threshold level.

5. The write driver strength control circuit of claim 1, wherein the tracking circuit is configured to determine the write error rate of the resistive memory by being configured to determine the write error rate of the resistive memory based on a plurality of write operations performed on a plurality of resistive memory elements in the resistive memory, wherein the write driver applies the write current to the plurality of resistive memory elements for the plurality of write operations.

6. The write driver strength control circuit of claim 1, wherein the tracking circuit is configured to determine the write error rate of the resistive memory by being configured to determine the write error rate of the resistive memory based on a plurality of write operations corresponding to a built-in self-test (BIST) performed on a plurality of resistive memory elements in the resistive memory.

7. The write driver strength control circuit of claim 6, further comprising a command generator configured to generate a plurality of write operations corresponding to the BIST.

8. The write driver strength control circuit of claim 1, further comprising a controller configured to:
   receive the write error rate of the resistive memory from the tracking circuit;
   provide the write error rate of the resistive memory to the write current calculator circuit; and
   provide a determined level of the write current to the write current adjust circuit based on the comparison of the write error rate to the target write error rate.

9. The write driver strength control circuit of claim 1, wherein the resistive memory comprises a magnetic random access memory (MRAM).

10. The write driver strength control circuit of claim 1 integrated into an integrated circuit (IC).

11. The write driver strength control circuit of claim 1 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

12. A write driver strength control circuit for adjusting a write current for a resistive memory, comprising:
   a means for determining a write error rate of a resistive memory based on at least one write operation performed on at least one resistive memory element in the resistive memory, wherein a write driver applies a write current to the at least one resistive memory element for the at least one write operation;
   a means for performing a comparison of the write error rate and a target write error rate for the resistive memory; and
   a means for adjusting the write current provided by the write driver to the resistive memory based on the comparison of the write error rate to the target write error rate.

13. A method of adjusting a write current for a resistive memory, comprising:
   determining a write error rate of a resistive memory based on at least one write operation performed on at least one resistive memory element in the resistive memory, wherein a write driver applies a write current to the at least one resistive memory element for the at least one write operation;
   performing a comparison of the write error rate and a target write error rate for the resistive memory; and
   adjusting the write current provided by the write driver to the resistive memory based on the comparison of the write error rate to the target write error rate.

14. The method of claim 13, wherein performing the comparison of the write error rate to the target write error rate comprises:
   providing the write error rate and the write current to a resistive memory write error statistical function; and determining the write current for the resistive memory corresponding to the target write error rate for the resistive memory based on the resistive memory write error statistical function.

15. The method of claim 14, wherein determining the write current based on the resistive memory write error statistical function comprises determining the write current by using the resistive memory write error statistical function to extrapolate the write current based on the write error rate and the target write error rate.

16. The method of claim 13, wherein adjusting the write current provided by the write driver to the resistive memory comprises adjusting the write current if a level of the write current resulting from a suggested adjustment is less than or equal to a defined threshold level.

17. A magnetic random access memory (MRAM) system comprising:
an MRAM;
a write driver configured to provide a write current to the MRAM; and
a write driver strength control circuit, comprising:
a tracking circuit configured to determine a write error rate of the MRAM based on at least one write operation performed on at least one MRAM element in the MRAM, wherein the write driver applies the write current to the at least one MRAM element for the at least one write operation;
a write current calculator circuit configured to perform a comparison of the write error rate and a target write error rate of the MRAM; and
a write current adjust circuit configured to adjust the write current provided by the write driver to the MRAM based on the comparison of the write error rate to the target write error rate.

18. The MRAM system of claim 17, wherein the write current calculator circuit is configured to perform the comparison of the write error rate and the target write error rate of the MRAM by being configured to:
provide the write error rate and the write current to an MRAM write error statistical function; and
determine the write current for the MRAM corresponding to the target write error rate for the MRAM based on the MRAM write error statistical function.

19. The MRAM system of claim 18, wherein the write current calculator circuit is configured to determine the write current based on the MRAM write error statistical function, by being configured to determine the write current by using the MRAM write error statistical function to extrapolate the write current based on the write error rate and the target write error rate.

20. The MRAM system of claim 17, wherein the write current adjust circuit is configured to adjust the write current provided by the write driver to the MRAM, by being configured to adjust the write current if a level of the write current resulting from a suggested adjustment is less than or equal to a defined threshold level.

\* \* \* \* \*